United States Patent [19]

Pujol et al.

[11] Patent Number: 5,143,785
[45] Date of Patent: Sep. 1, 1992

[54] CYANATE ESTER ADHESIVES FOR ELECTRONIC APPLICATIONS

[75] Inventors: Jean-Marc P. Pujol, Rhone, France; Joyce B. Hall, North St. Paul, Minn.; Peter B. Hogerton, White Bear Lake, Minn.; Fred B. McCormick, Maplewood, Minn.; Jeanne M. Tingerthal, White Bear Lake, Minn.

[73] Assignee: Minnesota Mining & Manufacturing Company, St. Paul, Minn.

[21] Appl. No.: 568,586

[22] Filed: Aug. 20, 1990

[51] Int. Cl.$^5$ .................... B32B 7/12; H01B 1/22; C08F 2/46; C08J 3/28; C08L 29/14; C08L 67/02; C08L 69/00; C08L 71/02; C08L 77/06

[52] U.S. Cl. .................... 428/352; 252/512; 252/514; 428/355; 522/66; 522/126; 522/146; 525/56; 525/403; 525/420; 525/436; 525/437; 525/462; 525/535

[58] Field of Search .......... 525/535, 56, 403, 420, 525/436, 437, 462, 534; 428/352, 355; 522/66, 126, 146; 252/512, 514

[56] References Cited

U.S. PATENT DOCUMENTS

| | | | |
|---|---|---|---|
| 3,530,087 | 9/1970 | Hayes et al. | 260/37 |
| 3,595,900 | 7/1971 | Loudas | 260/453 |
| 3,678,130 | 7/1972 | Klapprott et al. | 260/837 |
| 3,678,131 | 7/1972 | Klapprott et al. | 260/837 |
| 3,728,344 | 4/1972 | Emerson et al. | 525/360 |
| 3,733,349 | 5/1973 | Loudas et al. | 521/189 |
| 3,798,105 | 3/1974 | Hanna et al. | 156/307 |
| 3,962,184 | 6/1976 | Notomi et al. | 260/47 |
| 4,022,755 | 5/1977 | Tanigaichi et al. | 260/59 |
| 4,026,913 | 5/1977 | Tanigaichi et al. | 260/463 |
| 4,116,946 | 9/1978 | Jakob et al. | 528/172 |
| 4,195,132 | 3/1980 | Sundermann et al. | 521/155 |
| 4,331,582 | 5/1982 | Babyan et al. | 523/453 |
| 4,414,366 | 11/1983 | Wu et al. | 525/439 |
| 4,503,211 | 3/1985 | Robins | 528/92 |
| 4,528,366 | 7/1985 | Woo et al. | 528/422 |
| 4,554,346 | 11/1985 | Gaku et al. | 525/533 |
| 4,606,962 | 8/1986 | Reylek et al. | 428/148 |
| 4,645,805 | 2/1987 | Gaku et al. | 525/437 |
| 4,661,559 | 4/1987 | Gardner et al. | 525/65 |
| 4,680,226 | 7/1987 | Takeda | 428/327 |
| 4,684,678 | 8/1987 | Schultz et al. | 523/466 |
| 4,693,770 | 9/1987 | Hatada | 156/151 |
| 4,696,764 | 9/1987 | Yamazaki | 252/503 |
| 4,707,534 | 11/1987 | Schultz | 528/97 |
| 4,709,008 | 11/1987 | Shimp | 528/422 |
| 4,717,609 | 1/1988 | Gaku et al. | 428/49 |
| 4,729,019 | 4/1988 | Schappert et al. | 525/438 |
| 4,740,584 | 4/1988 | Shimp | 528/422 |
| 4,749,120 | 6/1988 | Hatada | 228/128 |
| 4,759,970 | 7/1988 | Seeger, Jr. et al. | 428/209 |
| 4,769,399 | 9/1988 | Schenz | 523/213 |
| 4,804,740 | 2/1989 | Gardner et al. | 528/422 |
| 4,814,040 | 3/1989 | Ozawa | 156/534 |
| 4,820,446 | 4/1989 | Prud'Homme | 252/511 |
| 4,822,683 | 4/1989 | Schappert et al. | 428/414 |
| 4,868,288 | 9/1989 | Meier | 534/15 |
| 4,902,752 | 2/1990 | Shimp | 525/390 |
| 4,996,267 | 2/1991 | Gerth et al. | 525/535 |
| 5,002,818 | 3/1991 | Licari et al. | 428/209 |

FOREIGN PATENT DOCUMENTS

| | | |
|---|---|---|
| 326931 | 8/1989 | European Pat. Off. |
| 0364073 | 4/1990 | European Pat. Off. |
| 113479 | 5/1989 | Japan |
| 113489 | 5/1989 | Japan |
| 1169613 | 11/1969 | United Kingdom |

OTHER PUBLICATIONS

E. Grigat et al., *Angew. Chem. Internat. Edit.*, 6, 206 (1967).

*Kirk-Othmer Encyclopedia of Chemical Technology*, 18, 605-610, 3rd edition (1982).

F. A. Hudock et al. technical paper presented at the IPC Fall Meeting held Sep. 21-25, 1986.

J. Cromyn, *Structural Adhesives*, edited by A. J. Kinloch (Elsevier) Applied Science Publishers, (1986).

K. Nakamura, *Nikkei Microdevices*, Jun., 1987, pp. 1-28.

K. Hatada et al., *Proceedings of the 5th IEEE/CHMT International Electronics Manufacturing Technology Symposium—Design-to-Manufacturing Transfer Cycle*, Oct. 10-12, 1988, pp. 23-27 "Micron Bump Bonding Assembly Technology".

P. B. Hogerton et al., "Investigations Into the Use of Adhesives for Level-1 Microelectronic Interconnections", Electronic Packaging Materials Science, Symposia Proceedings, Apr. 24-29, 1989.

R. S. Bauer, "Toughened High Performance Epoxy Resins: Modification with Thermoplastics", 34th International SAMPE Symposium, May 8-11, 1989, pp. 899-909.

R. R. Tummala and E. J. Rymaszewski, *Microelectronics Packaging Handbook*, (Van Nostrand Reinhold, 1989), pp. 280-309.

"AroCy TM B-40S Cynate Ester Resin Solution".

"AroCy TM T-30 Cyanate Ester Semisolid Resin".

"RTX 366 Developemental Cyanate Ester Monomer".

"AroCy TM M-30 Cyanate Ester Semisolid Resin".

M. Masuda et al., *Proceedings of the 1989 Japan IEMT Symposium, 6th IEEE/CHMT International Electronics Manufacturing Technology Symposium*, Apr. 26-28, (List continued on next page.)

Primary Examiner—James J. Seidleck
Assistant Examiner—Thomas Hamilton, III
Attorney, Agent, or Firm—Merchant, Gould, Smith, Edell, Welter & Schmidt

[57] ABSTRACT

The present invention provides an adhesive composition that is useful as an energy-curable, one-part adhesive, suitable for bonding electronic components. The adhesive composition, preferably provided as an adhesive film, comprises the reaction product of an admixture of an effective amount of a curable cyanate ester resin, a thermoplastic polymer, and a curing catalyst. The catalyst may be, for example, thermally or photochemically activated.

40 Claims, No Drawings

OTHER PUBLICATIONS 1989, pp. 55–58, "Chip on Glass Technology for Large Capacity and High Resolution LCD".

K. K. T. Chung et al., *Connection Technology*, Nov. 1989, pp. 37–39.

K. W. Glombitza and U. Wowler-Rieck, *Liebigs Ann. Chem.*, (1988), 261–265.

M. F. Hawthorne, *J. Org. Chem.*, 22, 1001 (1957).

D. Martin and M. Bauer, *Org. Synth.* 61, 35–38 (1983).

W. E. Parham and E. L. Anderson, *J. Am. Chem. Soc.*, 70, 4187 (1948).

Mitsubishi Gas Chem KK, Abstract of JP 63069883 (Dialog Accession No. 007490452).

CYANATE ESTER ADHESIVES FOR ELECTRONIC APPLICATIONS

FIELD OF THE INVENTION

The present invention relates to adhesive compositions, particularly adhesive compositions having properties especially suited for use in electronic applications.

BACKGROUND ART

Semiconductors, such as integrated circuits, are utilized in a wide variety of electronic devices, such as pocket calculators and laptop computers. Typically, semiconductors are formed on wafers which are cut into discs or chips that individually may be mounted on substrates. Typically, an integrated circuit is attached to a substrate by means of a bond that provides both electrical and thermal conductivity between the circuit and the substrate.

Known methods for making an electrically and thermally conductive bond between a die and a substrate include: employing a solder or eutectic alloy, such as a gold-silicon alloy; employing a spreadable adhesive consisting of heat-curing epoxy resin composition filled with fine metal particles; and employing an electrically and thermally conductive adhesive composition which comprises an adhesive containing fine metal particles or a deformable metal foil. See, for example, U.S. Pat. No. 4,606,962.

The metal eutectics are used most specifically in the area of power devices, to provide a metallurgical interface between a silicon die and the heat-sinking metal or ceramic substrate with optimum thermal and electrical conductivity. This technique is relatively successful for smaller devices, but is not desirable for use with larger dice, e.g., 1.5 cm on a side. The differential coefficients of expansion of the substrate and the silicon die can result in a larger die cracking under the stresses imparted by a very rigid bonding medium, and may result in its subsequent failure.

Epoxy-silver compositions are used extensively for commercial die-bonding, as they provide an often suitable compromise in terms of cost, stress-relief, and electrical/thermal conductivity. However, epoxy-silver compositions have the following undesirable characteristics: the lack of uniformity of dispersion of silver particles within the adhesive composition, the lack of uniformity of the mixture of two component systems (epoxy and curative), the lack of coplanar (die/substrate) maintenance during cure, the presence of resin bleed into the surrounding area or onto the die's active surface prior to curing, and unsuitably low shear strengths, as measured by the military standard, MIL-883C.

A desirable alternative bonding means is a conductive adhesive. Ideally, a conductive adhesive is provided as a self-supporting film. Prior art liquid epoxy systems require constant mixing to maintain a suitable dispersion of silver or other conductive particles, and must be dispensed in excess to assure that the entire die bonding surface is wet during die placement. These liquid systems by their nature will migrate due to capillary action and may contaminate or cover critical areas of the die or substrate in which no adhesive may be tolerated.

In contrast film is capable of being cut with the wafer to the precise size of the die. This provides the exact amount of adhesive in the precise area necessary for die bonding. Flow of this adhesive is very limited, and may occur only at the time of bonding, when flow is desired.

Adhesive films can also be used for establishing multiple, discreet electrical interconnections between two substrates. For these applications, the adhesive film may contain sparse populations of fine conductive particles, which provide electrical conductivity through the thickness of the film, but not in the plane of the film (anisotropically conductive). The use of a film-type adhesive for these applications provides the possibility of using either a random or a uniform particle distribution, which is a choice that is not available when using paste or liquid systems. Because of their anisotropic conductivity, these materials are often referred to as Z-axis Films (ZAF).

Unlike solder interconnections, ZAFs provide pressure-engaged interconnections. The role of the adhesive is to establish and maintain normal forces at each contact interface in order to provide stable and low-resistance interconnections. The source of these normal forces is thermal stress which builds during cool down from the bonding temperature and which builds during cool down from the bonding temperature and which is the direct result of thermal expansion mismatch between the adhesive and the conductive particles.

An adhesive that is used as an electrical interconnection medium must be in direct contact with a portion of the active circuitry. Thus, another important requirement of the adhesive is that it protect the contacted portion of the active circuitry from galvanic corrosion processes. In order to do this, it is important that the adhesive be essentially free of extractable ionic impurities, and it is also desirable that the adhesive possess low moisture absorption.

Despite the advantages achieved by using an adhesive interconnection, solder has continued to be the material of choice in many applications. Commercially available anisotropically conductive adhesive films have not demonstrated adequate performance under a sufficiently wide range of conditions to permit a more widespread use.

An improved anisotropically conductive adhesive, able to perform under a wider range of use conditions, is preferably relatively tack-free at room temperature to enable handling and repositioning of the undiced wafer prior to lamination. It is desirable that the adhesive film be capable of rapidly curing to effect bonding of a circuit to a variety of substrates. It is also desirable that the adhesive exhibit a long shelf life (i.e., is storage-stable); excellent creep resistance (substantially superior to solder); be essentially free from extractable ionic impurities, possess low moisture absorption; and is thermally curable to rapidly form an adhesive bond that exhibits superior shear strength, and adhesion to a multiplicity of substrates and surfaces.

DISCLOSURE OF THE INVENTION

The present invention provides adhesive composition that is useful as an energy-curable, one-part adhesive, suitable for bonding electronic components. The adhesive composition, preferably provided as an adhesive film, comprises the reaction product of an admixture of an effective amount of a curable cyanate ester resin thermoplastic polymer, and a curing catalyst. The catalyst may be, for example, thermally or photochemically activated.

The adhesive composition of the present invention preferably includes a silane coupling agent, and may also contain electrically conductive particles and other additives.

The cyanate ester resin comprises cyanate ester compounds (monomers and oligomers) each having two or more —OCN functional groups, and typically having a cyanate equivalent weight of about 50 to 500, preferably 50 to 250. The molecular weight of the cyanate ester monomers and oligomers are typically in the range of 150 to 2000.

The cyanate ester resin preferably includes one or more cyanate ester compounds according to Formulas I, II, III, or IV. Formula I is

Formula I wherein p can be an integer from 2 to 7, and wherein Q comprises at least one of: (1) a mono-, di-, tri-, or tetrasubstituted aromatic hydrocarbon containing 5 to 30 carbon atoms, and (2) 1 to 5 aliphatic or polycyclic aliphatic mono-, di-, tri-, or tetrasubstituted hydrocarbons containing 7 to 20 carbon atoms. Optionally, (1) and (2) may contain 1 to 10 heteroatoms selected from the group consisting of non-peroxidic oxygen, sulfur, non-phosphino phosphorus, non-amino nitrogen, halogen, and silicon. Formula II is

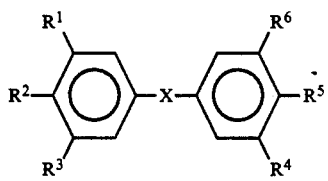
Formula II where X is a single bond, a $C_1$-$C_4$ alkylene group, —S—, or the —$SO_2$— group; and where $R^1$, $R^2$, $R^3$, $R^4$, $R^5$, and $R^6$ are independently —H, a $C_1$-$C_5$ alkyl group, or the Cyanate Ester Group:

—OC≡N with at least two of $R^1$, $R^2$, $R^3$, $R^4$, $R^5$, and $R^6$ being the Cyanate Ester Group. $R^1$, $R^2$, $R^3$, $R^4$, $R^5$, and $R^6$ are preferably —H, —$CH_3$, or the Cyanate Ester Group. Formula III is

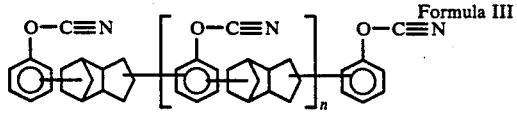
Formula III where n is 0 to 5. Formula IV is

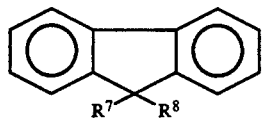
Formula IV where $R^7$, $R^8$ are independently
where $R^9$, $R^{10}$, $R^{11}$ are independently —H, a $C_1$-$C_5$ alkyl group, or the Cyanate Ester Group, preferably —H, —$CH_3$, or the Cyanate Ester Group, where $R^7$, $R^8$ combined include two or more Cyanate Ester Groups. $R^9$, $R^{10}$, and $R^{11}$ may be different for $R^7$ and $R^8$.

Cyanate esters according to Formula II are most preferred.

An effective amount of a thermoplastic polymer is added to aid in film formation and to toughen the cured adhesive. Without the thermoplastic the composition would not form the desired film and after curing the composition may be very brittle. The thermoplastic polymer preferably has a molecular weight of about 3,000 to 200,000. Lower molecular weights are preferable to promote resin flow at the bonding temperature. The thermoplastic polymer is preferably selected from the group consisting of polysulfones, polyvinyl acetals, polyamides, polyimides, polyesters, polyetherimides, polycarbonates, polyethers, polyimidesiloxanes, polycarbonatesiloxanes, polyvinylics, and phenoxy resins. Phenoxy, polysulfone, and polyvinyl acetal resins are preferred, with phenoxy being most preferred as adhesive compositions containing those resins typically tend to provide excellent shelf life and yield smooth, substantially transparent, flexible films.

A catalyst for the reaction between the cyanate ester compounds is provided in an amount sufficient to provide an adhesive composition that has a sufficiently short bonding time for the particular desired application, preferably less than 30 seconds.

An effective ratio of the cyanate ester resin and the thermoplastic polymer is defined as that ratio which will provide: an adhesive composition having a suitable shelf life at or below room temperature, a substantially tack-free adhesive film at a desired handling temperature, a tacky adhesive at a desired laminating temperature, and an adhesive film which will cure to a hard, tough material at an appropriate bonding temperature with good thermal stability at elevated temperatures.

DETAILED DESCRIPTION

The adhesive composition of the present invention may be produced by combining an effective amount of a curable cyanate ester resin, thermoplastic polymer, and a curing catalyst to provide an adhesive having the characteristics suited for a particular application.

The cyanate ester resin includes monomers and/or oligomers typically having an equivalent weight of about 50 to 500, preferably 50 to 250, and may include one or more suitable compounds according to Formulas I, II, III, and/or IV, which impart the desired resultant characteristics to the adhesive film. In electronic applications compounds according to Formula II are most preferred. The cyanate ester compounds provide desirable properties to the cured adhesive such as high $T_g$, low moisture absorption, and high modulus. It is preferred that the cyanate ester resin be present at about 25 to 95 percent by weight, more preferably 40 to 90 percent by weight.

Illustrative examples of cyanate ester monomers suitable for use in the present invention are described in copending application, U.S. Ser. No. 07/234,464, filed Aug. 19, 1988, incorporated herein by reference.

In the practice of this invention, a combination of cyanate ester monomers and oligomers can be used to provide a suitable cyanate ester resin that gives the adhesive composition desirable properties for a given end use. Examples of suitable cyanate ester compounds include the following: 1,3- and 1,4-dicyanatobenzene; 2-tert-butyl-1,4-dicyanatobenzene; 2,4-dimethyl-1,3-dicyanatobenzene; 2,5-di-tert-butyl-1,4-dicyanatobenzene; tetramethyl-1,4-dicyanatobenzene, 4-chloro-1,3-dicyanatobenzene; 1,3,5-tricyanatobenzene; 2,2,- or 4,4,-dicyanatobiphenyl; 3,3',5,5,-tetramethyl-4,4,-dicyanatobiphenyl; 1,3-, 1,4-, 1,5-, 1,6-, 1,8-, 2,6-, or 2,7-dicyanatonaphthalene; 1,3,6-tricyanatonaphthalene; bis(4-cyanatophenyl)methane; bis(3-chloro-4-cyanatophenyl)methane; bis(3,5-dimethyl-4-cyanatophenyl)methane; 1,1-bis(4-cyanatophenyl)ethane; 2,2-bis(4-cyanatophenyl)propane; 2,2-bis(3,5-dibromo-4-cyanatophenyl)propane; 2,2-bis(4-cyanatophenyl)-1,1,1,3,3,3-hexafluoropropane; bis(4-cyanatophenyl)ether; bis(4-cyanatophenoxyphenoxy)benzene; bis(4-cyanatophenyl)ketone; bis(4-cyanatophenyl)thioether; bis(4-cyanatophenyl)sulfone; tris(4-cyanatophenyl)phosphite; and tris(4-cyanatophenyl)phosphate.

Also useful are cyanic acid esters derived from phenolic resins (e.g., disclosed in U.S Pat. No. 3,962,184), cyanated novolac resins derived from novolac (U.S. Pat. No. 4,022,755), cyanated bisphenol-type polycarbonate oligomers derived from bisphenol-type polycarbonate oligomers (U.S. Pat. No. 4,026,913), cyanato-terminated polyarylene ethers (U.S. Pat. No. 3,595,900), dicyanate esters free of ortho hydrogen atoms (U.S. Pat. No. 4,740,584), mixtures of di-and tricyanates (U.S. Pat. No. 4,709,008), polyaromatic cyanates containing polycyclic aliphatic groups such as QUATREX® 7187 from Dow Chemical Co. (U.S. Pat. No. 4,528,366), fluorocarbon cyanates (U.S. Pat. No. 3,733,349), and other novel cyanate compositions (U.S. Pats. 4,195,132 and 4,116,946), all of which are incorporated herein by reference.

Polycyanate compounds obtained by reacting a phenol-formaldehyde precondensate with a halogenated cyanide are also useful.

Examples of preferred cyanate ester compositions include low molecular weight oligomers (M.W. about 250-1200) of bisphenol A dicyanates such as AroCy B-30 Cyanate Ester Semisolid Resin commercially available from Hi-Tek Polymers, Jeffersontown, Kentucky; low molecular weight oligomers of tetra o-methyl bisphenol F dicyanates, such as AroCy M-30 Cyanate Ester Semisolid Resin, commercially available from Hi-Tek Polymers; low molecular weight oligomers of thiodiphenol dicyanates, such as AroCy T-30 Cyanate Ester Semisolid Resin, commercially available from Hi-Tek Polymers; low molecular weight oligomers of fluorinated bisphenol A dicyanates such as AroCy F-40S Cyanate Ester Resin Solution commercially available from Hi-Tek Polymers; RTX 366 Developmental Cyanate Ester Monomer( available from Hi-Tek polymers; and liquid Cyanate Ester Monomer AroCy L-10, commercially available from Hi-Tek Polymers.

Thermoplastic Polymer

An effective amount of a thermoplastic polymer is added to aid in film formation in the uncured state and to toughen the cured adhesive. A thermoplastic polymer or resin is typically present at 5 to 75 percent by weight, and is preferably present at about 10 to 60 percent by weight.

Suitable thermoplastic polymers include polysulfones, polyvinyl acetals, polyamides, polyesters, polyimides, polycarbonates, polyethers, polyimidesiloxanes, polycarbonatesiloxanes, polyetherimides, polyvinylics, and phenoxy resins.

Suitable polysulfones include those falling within Formula V as follows:

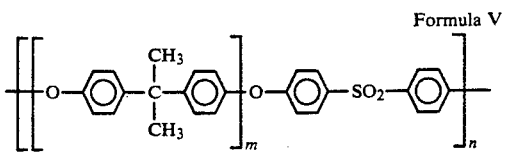

Formula V wherein m is 0 or 1, and n is 10 to 500. When m is 0, n is preferably about 12 to 50, and when m is 1, n is preferably about 40 to 70.

Examples of suitable polysulfones include P1700-NT11, a polysulfone resin from Amoco Performance Products, Ridgefield, Conn; and Victrex PES 5003P, a polysulfone, commercially available from ICI Advanced Materials, Wilmington, Del.

Suitable polyvinyl acetals include those falling within Formula VI as follows:

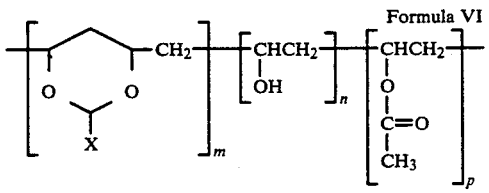

Formula VI wherein X is —H or a $C_1$–$C_4$ alkyl group, and m is 80 to 2400, n is 10 to 2200, and p is 0 to 500. Preferably m is greater than n, n is greater than p, m is less than 800, and each monomer is randomly distributed.

Suitable phenoxy resins include those falling within formula VII as follows:

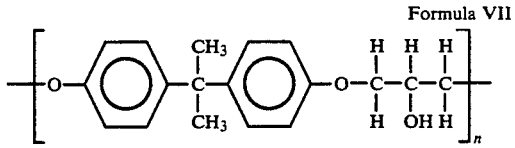

Formula VII wherein n is 75 to 150.

Illustrative examples of suitable phenoxy resins include UCAR phenoxy resins, commercially available from Union carbide Co., Inc., Danbury, Connecticut, available in three molecular weight grades, ranging from 25,000 to 35,000, designated PKHC, PKHH, and PKHJ.

Examples of suitable polyvinyl acetals include polyvinyl butyrals, such as Sekisui S-LEC BX-L.

Examples of polyamides include Unirez 2636, commercially available from Union Camp, Jacksonville, Fla. Examples of polyesters include Dynapol 206, commercially available from Hüls America, Inc. An example of a polycarbonatesiloxane is LR3320, from General Electric, Schenectady, New York. Examples of polyvinylics include polystyrene, polyacrylates, and polymethacrylates.

Catalysts

The use of a suitable catalyst is preferred to provide a rapid reaction between the cyanate ester compound(s) that make up the cyanate ester resin to provide cure of the adhesive in a satisfactorily short length of time, typically less than about 60 seconds at 180° C. Catalysts may be thermally or photochemically activated. Suitable sources of radiation for photoactivation of the catalysts include mercury vapor discharge lamps, tungsten lamps, xenon lamps, fluorescent lamps, sunlamps, lasers, carbon arcs, and sunlight. Photoactivated catalysts increase shelf life, and may thus be preferred.

Catalysts for the reaction of the cyanate ester include organometallic compounds containing a cyclopentadienyl group, $C_5H_5$, and suitable derivatives, such as cyclopentadienyl iron dicarbonyl dimer, $[C_5H_5Fe(CO)_2]_2$, pentamethylcyclopentadienyl iron dicarbonyl dimer, $[C_5(CH_3)_5Fe(CO)_2]_2$, methylcyclopentadienyl manganese tricarbonyl, $C_5H_4CH_3Mn(CO)_3$, cyclopentadienyl manganese tricarbonyl, $C_5H_5Mn(CO)_3$, all available from Strem Chemical Company, Newburyport, Mass., and hexafluorophosphate salt of the cyclopentadienyl iron mesitylene cation, $C_5H_5(mesitylene)Fe+PF_6$, and trifluoromethanesulfonate salt of the cyclopentadienyl iron mesitylene cation, $C_5H_5(mesitylene)Fe+CF_3SO_3$, both of which may be prepared by methods described in U.S. Pat. 4,868,288 which is incorporated herein by reference.

Other organometallic compounds which are suitable catalysts for use in the present invention are described in the aforementioned U.S. Application Serial No. 07/234,464.

Coupling Agents

The adhesive composition of the present invention may also include a coupling agent, e.g., silane coupling agent, to aid in adhesion of the adhesive to a given substrate.

Silane coupling agent is preferably provided at about 0.1 to 5 percent by weight of the composition, more preferably about 0.5 to 1.5 percent by weight. A silane coupling agent should include a silane group at one end of the molecule and a group reactive with the cyanate ester resin at the other end.

Preferred silane coupling agents have the formula:

$$P_{(4-n)}SiZ_n$$

in which:

P represents an organic substituent of up to 12 carbon atoms; e.g., propyl, which should possess functional substituents such as mercapto, epoxy, glycidoxy, acrylyl, methacrylyl and amino;

Z represents a hydrolyzable group, e.g., alkoxy, preferably methoxy or ethoxy; and n is 1, 2, or 3, preferably 3.

In addition to silane coupling agents, titanate and zirconate coupling agents may be utilized. The chapter on coupling agents by J. Cromyn in "Structural Adhesives" edited by A. J. Kinloch, published by Elsevier Applied Science Publishers, 1986, pp 269-312, is incorporated herein by reference. Page 270 provides examples of epoxy and amine silane coupling agents. Pages 306-308 discuss the use of titanate and zirconate coupling agents.

Additional Additives

Conductive particles, including, for example, those described in U.S. Pat. No. 4,606,962 (Reylek et al.), (incorporated herein by reference) may be added to the adhesive composition as desired. Reylek describes electrically and thermally conductive particles that at the bonding temperature of the adhesive are at least as deformable as are substantially pure silver spherical particles. The thickness of the particles exceeds the thickness of the adhesive between the particles. The particles described in Reylek are preferably substantially spherical and made of a metal such as silver or gold, or of more than one material, such as "a solder surface layer and either a higher melting metal core such as copper or a non-metallic core" (column 4, lines 20-21). These and other conductive particles (e.g., non-spherical and/or having a thickness of less than the thickness of the adhesive) are suitable for use in the adhesive composition of the present invention.

Conductive particles contained in adhesive compositions of the invention may be randomly dispersed therein or may be arranged in a uniform array of desired configuration. To economize the use of electrically conductive particles, they may be located only in segments of the adhesive film which are to contact individual electrical conductors.

Other fillers can be added to the adhesive composition. The use of a filler can provide benefits of increased adhesion, higher modulus, and decreased coefficient of thermal expansion. Useful fillers include, but are not limited to, the following: silica particles, silicate particles, quartz particles, ceramics particles, glass bubbles, inert fibers, and mica particles. Preferably, the filler is microcrystalline silica particles.

Additives designed to lower the cross-link density, reducing brittleness and toughening the film, may also be added, as desired. An example of such a class of useful compounds are monofunctional cyanate esters, such as those according to Formula I wherein p is 1. Monofunctional esters are preferably present at about 0.1 to 10 percent by weight, preferably equal to about 1 to 20 percent of the cyanate ester resin (multifunctional).

It is important that the adhesive composition have a low ionic impurity level. The electronics industry specifies low extractable ion content of the adhesives. Specifications typically include limits of $Cl^-$, $Na^+$, $K^+$, and $NH_4^+$ of less than 10 parts per million by weight. Such extremely low ionic contents are important to prevent corrosion of the metals and to keep the conductivity of the adhesive as low as possible, except through any conductive metal particles present.

In the following, examples, which are intended to be merely illustrative and nonlimiting, all parts are by weight.

EXAMPLES

Example 1

An adhesive of the present invention was prepared by mixing the following components:

| Component | Parts |
| --- | --- |
| Polyvinylbutyral BX-L[1] | 13.32 |
| Cyanate ester[2] | 13.32 |
| $[C_5H_5Fe(CO)_2]_2$ | 0.05 |
| (3-glycidoxypropyl)trimethoxysilane (3-GPMS) | 0.30 |
| Au/Ni/polystyrene conductive particles[3] | 3.00 |
| tetrahydrofuran | 70.01 |

[1] S-LEC from Sekisui Chemical Co., Osaka, Japan
[2] AroCy B-30 from Hi-Tek Polymers
[3] Fine Pearl from Sumitomo Chemical The polyvinyl butyral and the cyanate ester were dissolved in the tetrahydrofuran, followed by addition of the silane, the catalyst, and the conductive particles, all being added and mixed into the solution. The adhesive composition was cast onto a polyester film using a knife coater. The thickness of the adhesive was about 35 micrometers ("μm"). The polyester film had a silicone release coating to facilitate the release of the adhesive. The adhesive film was dried at room temperature for 24 hours.

Examples 2-6

Adhesive compositions of the present invention were prepared as in Example 1 using the amounts of the components (parts) listed in Table 1 below

TABLE 1

| | Formulations of Examples 2-6 | | | | |
|---|---|---|---|---|---|
| Component | Ex. 2 | Ex. 3 | Ex. 4 | Ex. 5 | Ex. 6 |
| Polyvinylbutyral BX-L[1] | 13.22 | 15.14 | 15.78 | 0 | 0 |
| Polysulfone P1700[2] | 0 | 0 | 0 | 15.00 | 0 |
| Polysulfone 5003P[3] | 0 | 0 | 0 | 0 | 12.19 |
| Cyanate ester B-10[4] | 0 | 7.57 | 22.32 | 14.45 | 17.24 |
| Cyanate ester B-30[4] | 13.22 | 7.57 | 0 | 0 | 0 |
| $C_5H_5$(Mesitylene)Fe$^+$CF$_3$SO$_3^-$ | 0 | 0.08 | 0 | 0 | 0 |
| [$C_5H_5$Fe(CO)$_2$]$_2$ | 0.15 | 0 | 0.12 | 0.08 | 0.09 |
| 3-GPMS | 0.30 | 0 | 0.61 | 0.47 | 0.48 |
| Au/Ni/polystyrene particles[5] | 3.00 | 0 | 0 | 0 | 0 |
| tetrahydrofuran | 70.11 | 69.64 | 61.16 | 0 | 0 |
| dichloromethane | 0 | 0 | 0 | 70.00 | 0 |
| N,N dimethylformamide | 0 | 0 | 0 | 0 | 70.00 |

[1] S-LEC from Sekisui Chemical Co., Osaka, Japan
[2] Udel from Amoco Chemicals Co., Ridgefield, CT
[3] Victrex from ICI Inc., Wilmington, DE
[4] AroCy from Hi-Tek Polymers
[5] Fine Pearl from Sumitomo Chemical

Example 7

The adhesion of various adhesive compositions of the present invention was evaluated by measuring the die shear strength. The test determined the applied force necessary to shear the chip from the substrate. The bond strength was also measured using test specimens consisting of glass chips (2 mm×2 mm×1 mm) bonded to glass slides (25 mm×25 mm×1 mm).

The chips were bonded to the slide by first applying the adhesive to the chips using heat activation and pressure to melt the adhesive. The chips coated with adhesive were then applied to the slide with bonding accomplished by use of a die bonder with a bond time of several seconds at 180° C. under 2.5 megapascals ("MPa") of pressure.

The chips were subsequently sheared using a Model 6000 Die Shear Tester from Semiconductor Equipment Corp., Moorpark, Calif. The results are summarized in Table 2.

TABLE 2

| Adhesion of Cyanate Ester Adhesives | | |
|---|---|---|
| Adhesive Composition (Example) | Bonding Time (Seconds) | Shear Strength[1] (MPa) |
| 1 | 15 | 10.2 |
| 1 | 30 | 17.0 |
| 2 | 15 | 20.1 |
| 2 | 30 | 21.2 |
| 3 | 30 | 18.5 |
| 4 | 60 | 25.6 |
| 5 | 60 | 13.6 |
| 6 | 60 | 14.9 |

[1] The specification for the selection and use of adhesives for certain applications in microelectronics suggests a minimum bond strength of 6 MPa (MIL STD 883 C, method 5011).

As shown in Table 2, the adhesive compositions of the present invention provide a significant level of shear strength in a short bonding time (15 to 60 seconds).

Example 8

Adhesive compositions of the present invention were used to bond flexible circuits to printed circuit boards. The flexible circuits were made from polyamide film strips of 10 mm width and 25 μm thickness and containing 17 copper conductors of 0.2 mm width and 35 μm thickness. Each copper conductor was protected with a layer of lead-tin solder 12 μm thick. The center-to-center spacing of the conductors was 0.4 mm. The printed circuit boards were FR-4 epoxy-glass laminates having copper conductors of essentially the same construction as the conductors on the flexible circuit. Each test board contained two sets of traces, one set on each side of the board, separated by a gap of approximately 2.5 cm. For each board, a flexible circuit sample was bonded to each set of traces, thereby forming an electrical bridge from one side of the board to the other.

The interconnections between the flexible circuit and the circuit board were made with the use of the film of the present invention. Film samples of 3 mm×8 mm were transferred to each end of the flexible circuit using heat activation and slight pressure. The final bonding to the board was done by placing the flexible circuit on the board, aligning the stripes, applying a pressure of 2 MPa to the bond area and heating the adhesive to 180° C. with the use of a Unitek Phasemaster-4 hot-bar bonder.

Interconnection resistances were measured using a four-wire method. Each resistance measurement included the resistance of the copper traces on both the printed circuit board and the flexible circuit as well as the resistance of the two interconnections. The resistances of the copper traces varied from trace to trace and from board to board, and ranged in value from 180 to 250 milliohms ("mΩ"). On each circuit board, the variation from the minimum to the maximum trace resistance was approximately 40 to 50 mΩ. The results of these tests are summarized in Tables 3 and 4. With these conditions, it is considered that a value lower than 0.5 ohms ("Ω") indicates a good interconnection.

TABLE 3

| | Interconnection Resistances | | | |
|---|---|---|---|---|
| Adhesive Composition (Example) | Bonding Time (Seconds) | R Average (Ω) | R Min. (Ω) | R Max. (Ω) |
| 1 | 120 | 0.19 | 0.18 | 0.22 |
| 2 | 15 | 0.30 | 0.27 | 0.32 |
| 2 | 8 | 0.34 | 0.25 | 0.40 |

As shown in Table 3, good electrical connections are obtained from the adhesive compositions of the present invention.

Example 9

Environmental testing of the test samples of the adhesive compositions of the present invention from Example 8 (cyanate ester adhesives used to bond flexible circuit boards) were conducted under humidity aging, thermal aging, and thermal cycling. The interconnection resistances set forth in Table 4 were measured after 1,000 hours of testing.

The results set forth in Table 4 indicate that no significant degradation of contact resistances occurred under these test conditions. The adhesive compositions of the present invention demonstrate high stability under environmental testing.

TABLE 4

Interconnection Resistances After Environmental Testing

| Adhesive Composition (Example) | Bonding Time (Seconds) | Test | 1000 hour | | |
|---|---|---|---|---|---|
| | | | R Av. ($\Omega$) | R Min. ($\Omega$) | R Max. ($\Omega$) |
| 1 | 120 | Thermal cycling −40, +105° C.[1] | 0.20 | 0.18 | 0.22 |
| 1 | 120 | Thermal cycling −55, +125° C.[1] | 0.24 | 0.21 | 0.26 |
| 1 | 120 | Thermal aging 100° C. | 0.23 | 0.20 | 0.26 |
| 1 | 120 | Thermal aging 125° C. | 0.21 | 0.19 | 0.24 |
| 1 | 120 | Humidity aging 60° C., 95% RH | 0.21 | 0.19 | 0.23 |
| 1 | 120 | Humidity aging 85° C., 85% RH | 0.24 | 0.21 | 0.26 |
| 1 | 120 | Humidity aging 60° C., 95% RH, 15 V biased | 0.24 | 0.21 | 0.28 |
| 2 | 15 | Humidity aging 85° C., 85% RH | 0.36 | 0.30 | 0.54 |
| 2 | 8 | Humidity aging 85° C., 85% RH | 0.36 | 0.26 | 0.44 |

[1] 6 hour cycle time

Example 10

An adhesive of the present invention was prepared according to the procedure of Example 1 by mixing the following components:

| Component | Parts |
|---|---|
| polyvinylbutyral BX-L | 13.32 |
| cyanate ester B-30 | 13.32 |
| 3-GPMS | 0.27 |
| [$C_5H_5Fe(CO)_2$]$_2$ | 0.126 |
| Bell Pearl[1] | 1.35 |
| tetrahydrofuran | 31.5 |

[1] Ni on phenolic resin particles, commercially available from Kanebo.

In order to measure the dielectric constant and dissipation factor, films according to Example 10 were prepared having an approximate thickness of 10 µm, and were spin coated onto copper films (0.3 µm) deposited onto 10 cm diameter silicon wafers. Subsequently, a 6.4 mm diameter Cu electrode was deposited onto the film to form a capacitor. Measurements were made with a Hewlett-Packard 4192A LF Impedance Analyzer. The results shown in Table 5 indicate good dielectric properties.

The adhesive film of Example 10 was measured for moisture absorption by exposing fully cured, free-standing films to 85° C./85%RH and then measuring the equilibrium weight gain. The film samples were 25 µm thick and weighed 10 grams ("g"). All weight gains were measured by rapidly transferring the film samples from the oven to a tared glass jar in order to avoid moisture loss prior to the measurement. An exposure of 300 hours was sufficient to reach equilibrium. The results shown in Table 5 indicate exceptionally low moisture absorption.

The extractable chloride level was measured using a Hewlett-Packard 1090 Liquid Chromatograph, and extractable cation levels were measured using an ARL 3580 Inductively Coupled Plasma Spectrascope. A fully cured, free-standing film of this Example, having a 25 µm thickness and weighing 3 g was immersed in 60 milliliters ("ml") of boiling water at 2 atmospheres of pressure for four hours, after which a sample of water was analyzed for extracted species. All extracted material was assumed to be ionic. The extractable ion contents were near or below the detection limits of all species. Detection limits ranged from 0.5 to 5 ppm with the exception potassium (K), which had a limit of 20 ppm. The results listed in Table 5 exclude K, but none the less, indicate a high degree of purity.

TABLE 5

Miscellaneous Property Values of the Film

| PROPERTY | CONDITION | VALUE |
|---|---|---|
| AC Impedance | Ambient | >1.12 $\Omega$/sq. |
| AC Dielectric Strength | Ambient | >5 kV/mm |
| DC Dielectric Strength | Ambient | >8 kV/mm |
| Dielectric Constant | Ambient | 3.2% @ 1 kHz |
| Dissipation Factor | Ambient | 0.6% @ 1 KHz |
| Ionic Extractables (All Cations + Cl) | 4 hrs, Boiling Water, 2 atm. | <5 ppm each |
| Moisture Absorption | Equil @ 85° C./ 86% RH | 1.2% |

Adhesive bonds were prepared with the use of a Unitek Phasemaster-4 hot-bar type bonder that is commonly used for solder reflow operations. A solid blade type thermode of 1.5 mm width was used for all bond preparations. The thermode setpoint required to achieve an adhesive temperature of 180° C. varied depending on the substrate type, due to differences in the thermal diffusivities of the materials, and was determined with the use of instrumented test samples. The bonding conditions that were used for various bond types are described in Table 6.

TABLE 6

Bonding Conditions

| Bonding Type | Thermode Set Pt. (°C.) | Interface Temp. (°C.) | Pressure (kg./sq.cm) | Soak Time (s) | Release Temp. (°C.) |
|---|---|---|---|---|---|
| Adhesive-PCB[1] | 265 | 180 | 20 | 20 | 135 |
| Adhesive-Glass | 335 | 180 | 20 | 20 | 170 |
| Solder-PCB[1] | 365 | 240 | 20 | 15 | 185 |

[1] PCB - Printed Circuit Board

Examples 11–13

Adhesive compositions of the present invention were prepared according to the procedure of Example 1 using the following amount of the components (parts) listed in Table 7 below.

TABLE 7

Formulations for Examples 11-13

| Component | Ex. 11 | Ex. 12 | Ex. 13 |
|---|---|---|---|
| Polyvinylbutyral BX-L[1] | 21.91 | 21.91 | 21.91 |
| Cyanate ester B-30[2] | 21.91 | 21.91 | 21.91 |
| 3-GPMS | 0.44 | 0.44 | 0.44 |
| $C_5H_5$(Mesitylene)Fe$^+$PF$_6^-$ | 0.21 | 0 | 0 |
| $C_5H_5Mn(CO)_3$ | 0 | 0.21 | 0 |
| $C_5H_5CH_3Mn(CO)_3$ | 0 | 0 | 0.21 |

TABLE 7-continued

| Formulations for Examples 11-13 | | | |
|---|---|---|---|
| Component | Ex. 11 | Ex. 12 | Ex. 13 |
| Tetrahydrofuran | 55.52 | 55.52 | 55.52 |

[1]S-LEC from Sekisui Chemical Company, Osaka, Japan
[2]AroCy from Hi-Tek Polymers All three samples were irradiated at room temperature through a photographic mask (3M Exposure Guide #77-9803-0125-2, 3M Company, St. Paul, Minnesota) with the light from two GE Blak-ray 15 watt blacklights (primary wavelength 366nm) (General Electric Co., Schenectady, N.Y.) for five minutes from a distance of 1.5 cm. The mask was removed and a latent negative image of the mask was clearly visible in all three samples. Example 11 was placed in a dark, 100° C. oven for seven minutes and Examples 12 and 13 were placed in the same oven for ten minutes. After cooling to room temperature, all three samples were rinsed with acetone which dissolved the unexposed regions and left an insoluble cured film in the negative image of the resolution mask.

Bond strength of the adhesives of Examples 11-13 was measured according to Example 7, with a bonding time of 60 seconds. The results are set forth below in Table 8 (MPa).

TABLE 8

| | Ex. 11 | Ex. 12 | Ex. 13 |
|---|---|---|---|
| No U.V. light | 5.7 | 3.3 | 5.0 |
| With U.V. light | 6.6 | 5.1 | 5.9 |

This demonstrated that the curing of the adhesive compositions of the present invention can be photoactivated and that photoactivation gave improved bonding.

Example 14

An adhesive composition of the present invention was prepared by mixing the following components:

| Components | Parts |
|---|---|
| Polyvinylbutyral BX-L | 4.0 |
| Cyanate ester B-30 | 16.0 |
| 3-GPMS | 0.20 |
| [$C_5H_5Fe(CO)_2$]$_2$ | 0.151 |
| tetrahydrofuran | 22.0 |

Shear testing of samples of Example 14 were conducted according to Example 7 with a bonding time of 60 seconds. The results of 5.2 MPa.

Examples 15-19

Adhesive compositions of the present invention were prepared by mixing the following components:

| | Parts | | | | |
|---|---|---|---|---|---|
| Components | Ex. 14 | Ex. 15 | Ex. 16 | Ex. 17 | Ex. 18 |
| PKHC[1] | 10.0 | 10.0 | 10.0 | 10.0 | 10.0 |
| Cyanate Ester B-30[2] | 10.0 | 0 | 0 | 0 | 0 |
| Quatrex 7187[3] | 0 | 10.0 | 0 | 0 | 0 |
| Cyanate Ester M-20[2] | 0 | 0 | 10.0 | 0 | 0 |
| Cyanate Ester RTX366[4] | 0 | 0 | 0 | 10.0 | 0 |
| Cyanate Ester L-10 | 0 | 0 | 0 | 0 | 10.0 |
| 3-GPMS | 0.2 | 0.2 | 0.2 | 0.2 | 0.2 |
| [$C_5H_5Fe(CO)_2$]$_2$ | 0.1 | 0.1 | 0.1 | 0.1 | 0.1 |
| THF | 20.0 | 20.0 | 20.0 | 20.0 | 20.0 |

[1]UCAR Phenoxy Resin from Union Carbide Corporation
[2]AroCy from Hi-Tek Polymers
[3]Cyanate ester resin from Dow Chemical Co.
[4]Experimental resin from Hi-Tek Polymers Smooth, transparent, flexible films were obtained from all formulations. Two of these formulations (Ex. 17 and Ex. 18) were used to bond flexible printed circuits to printed circuit boards, as in Example 8, except a 20 second bonding time was used for both samples. The strength of the adhesive bonds were measured using an Instron Tensile Tester, Model 1122, at a peel rate of 0.1 inch/minute (90° peel). Average adhesive values were:

| Example 17 | 2.4 lb/linear inch |
|---|---|
| Example 18 | 4.5 lb/linear inch |

We claim:

1. An energy curable, one-part, adhesive composition adapted to be used in electronic applications, comprising the reaction product of an admixture of:
   a) an effective amount of a curable cyanate ester resin including one or more cyanate ester compounds;
   b) an effective amount of a thermoplastic polymer; and
   c) an effective amount of a catalyst comprising an organometallic compound, for the reaction of said cyanate ester compounds;
   wherein said adhesive composition is curable in 60 seconds or less at 180° C.

2. The adhesive composition of claim 1 wherein said cyanate ester compounds have a cyanate equivalent weight of about 50 to 500.

3. The adhesive composition of claim 2 wherein said cyanate ester compounds have a cyanate equivalent weight of about 50 to 250.

4. The adhesive composition of claim 1 wherein said cyanate ester resin is present at about 25 to 95 weight percent.

5. The adhesive composition of claim 4 wherein said cyanate ester resin is present at about 40 to 90 weight percent.

6. The adhesive composition of claim 1 wherein said thermoplastic polymer is present at about 5 to 75 percent by weight.

7. The adhesive composition of claim 6 wherein said thermoplastic polymer is present at about 10 to 60 percent by weight.

8. The adhesive composition of claim 1 wherein said cyanate ester resin includes one or more cyanate ester compounds having a molecular weight of about 150 to 2000.

9. The adhesive composition of claim 8 wherein said cyanate ester compounds have a molecular weight of about 250 to 1200.

10. The adhesive composition of claim 1 further including a silane coupling agent.

11. The adhesive composition of claim 10 wherein said silane coupling agent is present at about 0.1 to 5 percent by weight.

12. The adhesive composition of claim 11 wherein said silane coupling agent is present at about 0.5 to 1.5 percent by weight.

13. The adhesive composition of claim 10 wherein said silane coupling agent has the following formula:

in which:
P represents an organic substituent of up to 12 carbon atoms; e.g., propyl, which should possess functional substituents selected from the group consisting of mercapto, epoxy, glycidoxy, acrylyl, methacrylyl and amino;
Z represents a hydrolyzable group; and
n is 1, 2, or 3.

14. The adhesive composition of claim 1 wherein said cyanate ester resin includes one or more cyanate ester compositions having the following general formulas:

 Formula I wherein p can be an integer from 2 to 7, and wherein Q comprises at least one of: (1) a mono-, di-, tri-, or tetrasubstituted aromatic hydrocarbon containing 5 to carbon atoms, and (2) 1 to 5 aliphatic or polycyclic aliphatic mono-, di-, tri-, or tetrasubstituted hydrocarbons containing 7 to 20 carbon atoms;

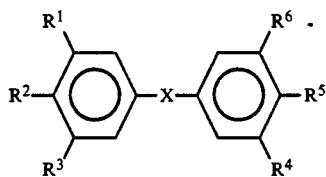 Formula II wherein X is a single bond, a $C_1$–$C_4$ alkylene group, —S—, or the —$SO_2$— group; and where $R^1$, $R^2$, $R^3$, $R^4$, $R^5$, and $R^6$ are independently —H, a $C_1$–$C_5$ alkyl group, or the Cyanate Ester Group:

—OC≡N with at least two of $R^1$, $R^2$, $R^3$, $R^4$, $R^5$, and $R^6$ being the Cyanate Ester Group;

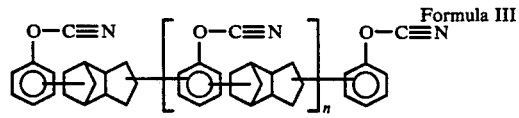 Formula III where n is 0 to 5; or

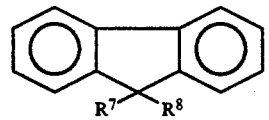 Formula IV wherein $R^7$, $R^8$ are independently
wherein $R^9$, $R^{10}$, and $R^{11}$ are independently —H, a $C_1$–$C_5$ alkyl group, or the Cyanate Ester Group, where $R^7$, $R^8$ combined include two or more Cyanate Ester Groups.

15. The adhesive composition of claim 14 wherein said cyanate ester compounds according to Formula I contain 1 to 10 heteroatoms selected from the group consisting of non-peroxidic oxygen, sulfur, non-phosphino phosphorus, non-amino nitrogen, halogen, and silicon.

16. The adhesive composition of claim 14 wherein said cyanate ester resin includes one or more cyanate ester compounds according to Formula II.

17. The adhesive composition of claim 16 wherein $R^1$, $R^2$, $R^3$, $R^4$, $R^5$, and $R^6$ are —H, —$CH_3$, or the Cyanate Ester Group.

18. The adhesive composition of claim 14 wherein $R^9$, $R^{10}$, and $R^{11}$ are —H, —$CH_3$, or the Cyanate Ester Group.

19. The adhesive composition of claim 1 wherein said thermoplastic polymer has a molecular weight of about 3,000 to 200,000.

20. The adhesive composition of claim 19 wherein said thermoplastic polymer is selected from the group consisting of: polysulfones, polyvinyl acetals, polyamides, polyesters, polyimides, polycarbonates, polyethers, polyimidesiloxanes, polycarbonatesiloxanes, polyetherimides, polyvinylics, and phenoxy resins.

21. The adhesive composition of claim 19 wherein said thermoplastic polymer has the following formula:

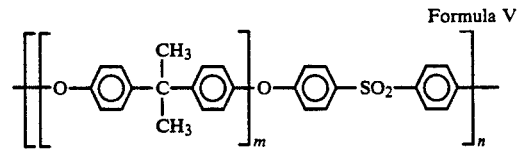 Formula V wherein m is 0 or 1, and n is 10 to 500.

22. The adhesive composition of claim 21 wherein m is 0 and n is about 12 to 50.

23. The adhesive composition of claim 21 wherein m is 1 and n is about 40 to 70.

24. The adhesive composition of claim 19 wherein said thermoplastic polymer has the following formula:

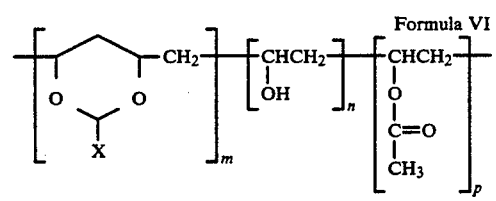 Formula VI wherein X is —H or a $C_1$–$C_4$ alkyl group, and m is 80 to 2400, n is 10 to 2200, and p is 0 to 500.

25. The adhesive composition of claim 24 wherein m is greater than n, n is greater than p, m is less than 800, and the monomers are randomly distributed.

26. The adhesive composition of claim 19 wherein said thermoplastic polymer has the following formula:

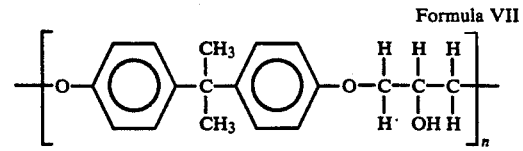 Formula VII wherein n is about 75 to 150.

27. The adhesive composition of claim 1 further including at least one additive selected from the group consisting of catalysts, conductive particles, coupling agents, and filler.

28. The adhesive composition of claim 1 wherein said catalyst is an organometallic compound containing a cyclopentadienyl group.

29. The adhesive composition of claim 1 wherein said catalyst is thermally activated.

30. The adhesive composition of claim 1 wherein said catalyst is photochemically activated.

31. The adhesive composition of claim 1 further including about 0.1 to 10 percent by weight of a monofunctional cyanate.

32. The adhesive composition of claim 31 wherein said monofunctional cyanate is a cyanate ester according to Formula I wherein p is 1.

33. The adhesive composition of claim 32 wherein said monofunctional cyanate is present at a concentration of about 1 to 20 percent of the cyanate ester resin.

34. The adhesive composition of claim 1 provided as a storage-stable, substantially tack-free adhesive film.

35. The adhesive composition of claim 34 wherein said adhesive film is anisotropically conductive.

36. The adhesive composition of claim 35 wherein said adhesive film contains randomly dispersed conductive particles.

37. The adhesive composition of claim 35 wherein said conductive particles are arranged in a uniform array of predetermined configuration.

38. The adhesive composition of claim 1 having an extractable ion content of less than about 10 parts per million by weight.

39. An adhesive film comprising the adhesive composition of claim 1.

40. The adhesive film of claim 39 further including a release liner.

* * * * *

UNITED STATES PATENT AND TRADEMARK OFFICE
CERTIFICATE OF CORRECTION

PATENT NO. : 5,143,785

DATED : September 1, 1992

INVENTOR(S) : Jean Marc P. Pujol et al.

It is certified that error appears in the above-identified patent and that said Letters Patent is hereby corrected as shown below:

Column 2, line 58, insert --an-- after the word "provides";

Column 2, line 63, insert --, a-- after the word "resin";

Column 3, lines 62 and 63, after "independently" and before "where", insert -- 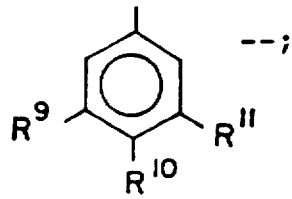 --;

Column 4, line 68, "2,2," should read --2,2'--;

Column 5, line 1, "4,4," should read --4,4'--;

Column 5, line 1, "5,5," should read --5,5'--;

Column 5, line 49, delete "(" after the word "Monomer";

Column 13, line 52, "results of" should read --result was--;

UNITED STATES PATENT AND TRADEMARK OFFICE
CERTIFICATE OF CORRECTION

PATENT NO. : 5,143,785

DATED : September 1, 1992

INVENTOR(S) : Jean Marc P. Pujol et al.

It is certified that error appears in the above-identified patent and that said Letters Patent is hereby corrected as shown below:

Column 14, line 17, "adhesive" should read --adhesion--;

Column 15, claim 14, line 24, insert --30-- after the word "to"; and

Column 15, claim 14, lines 62, 63, after "independently" and before "wherein", insert

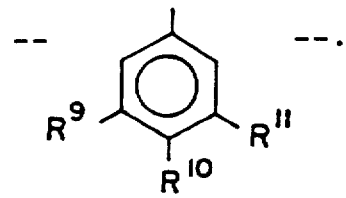

Signed and Sealed this

Fourth Day of January, 1994

Attest:

BRUCE LEHMAN

Attesting Officer

Commissioner of Patents and Trademarks